(12) United States Patent
Goss et al.

(10) Patent No.: US 8,811,074 B2
(45) Date of Patent: Aug. 19, 2014

(54) PARAMETRIC TRACKING TO MANAGE READ DISTURBED DATA

(75) Inventors: Ryan James Goss, Prior Lake, MN (US); David Scott Seekins, Shakopee, MN (US); Mark Allen Gaertner, Vadnais Heights, MN (US)

(73) Assignee: Seagate Technology LLC, Cupertino, CA (US)

( * ) Notice: Subject to any disclaimer, the term of this patent is extended or adjusted under 35 U.S.C. 154(b) by 211 days.

(21) Appl. No.: 13/438,446

(22) Filed: Apr. 3, 2012

(65) Prior Publication Data
US 2013/0258770 A1 Oct. 3, 2013

(51) Int. Cl.
*G11C 16/04* (2006.01)
*G11C 16/34* (2006.01)

(52) U.S. Cl.
CPC .................................. *G11C 16/3418* (2013.01)
USPC ............ 365/185.02; 365/185.22; 365/185.25; 365/185.18

(58) Field of Classification Search
CPC . G11C 16/3418; G11C 16/0483; G11C 16/10
USPC .............. 365/185.02, 185.22, 185.25, 185.18
See application file for complete search history.

(56) References Cited

U.S. PATENT DOCUMENTS

| | | | |
|---|---|---|---|
| 5,917,766 A | 6/1999 | Tsuji et al. | |
| 6,240,016 B1 | 5/2001 | Haddad et al. | |
| 6,707,714 B2 | 3/2004 | Kawamura | |
| 6,870,766 B2 | 3/2005 | Cho et al. | |
| 7,177,977 B2 | 2/2007 | Chen et al. | |
| 7,262,994 B2 | 8/2007 | Fong et al. | |
| 7,623,385 B2 | 11/2009 | Kim et al. | |
| 7,864,574 B2 | 1/2011 | Cho et al. | |
| 7,975,192 B2 | 7/2011 | Sommer et al. | |
| 8,443,263 B2 * | 5/2013 | Selinger et al. | 714/768 |
| 2008/0239826 A1 * | 10/2008 | Ogawa et al. | 365/185.22 |
| 2009/0290432 A1 * | 11/2009 | Park | 365/185.25 |
| 2011/0047421 A1 * | 2/2011 | Schuette | 714/718 |
| 2011/0066899 A1 * | 3/2011 | Kang et al. | 714/54 |

* cited by examiner

*Primary Examiner* — Connie Yoha
(74) *Attorney, Agent, or Firm* — Hall Estill Attorneys at Law

(57) ABSTRACT

Method and apparatus for managing data in a memory, such as a flash memory array. In accordance with various embodiments, data are stored in a first location in a memory, and read from the first location a selected number of times. At least one parameter associated with the first location is measured after the data are read the selected number of times. The data are thereafter migrated to a second location in the memory responsive to the measured parameter indicating a presence of read disturbance in the data in the first location.

20 Claims, 4 Drawing Sheets

PARAMETRIC TRACKING TO MANAGE READ DISTURBED DATA

SUMMARY

Various embodiments disclosed herein are generally directed to the management of data in a memory, such as but not limited to a flash memory array.

In accordance with some embodiments, data are stored in a first location in a memory, and read from the first location a selected number of times. At least one parameter associated with the first location is measured after the data are read the selected number of times. The data are thereafter migrated to a second location in the memory responsive to the measured parameter indicating a presence of read disturbance in the data in the first location.

These and other features and advantages which may characterize various embodiments can be understood in view of the following detailed discussion and the accompanying drawings.

DETAILED DESCRIPTION

Figure 1:
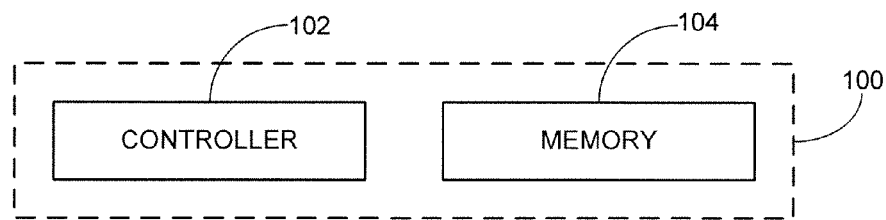
FIG. 1 provides a functional block representation of an exemplary data storage device in accordance with some embodiments.

The present disclosure generally relates to the management of data in a memory, such as but not limited to data stored in a flash memory array.

Read disturbance is a phenomenon that can affect a wide variety of different types of memory devices. Generally, read disturbance involves the changing of a programmed state of a memory location responsive to repeated read operations upon that memory location. While read disturbed data can be induced in a variety of operational applications, it can be of particular concern in read priority environments where the number of data read operations is significantly greater than the number of data write operations and, if applicable, data erase operations.

In a flash memory cell, read disturbance can result in small shifts in the amount of total accumulated charge on a floating gate structure of the cell after a succession of read operations have taken place upon the cell. If the amount of shift in accumulated charge becomes sufficiently pronounced, the memory device may not be able to reliably sense the amount of accumulated charge, and hence the programmed state, of the cells.

Some flash memory array suppliers recommend that data within an array be moved to a new location within the array after a specified threshold number of reads, such as 100,000 (100K) reads, have been performed since the most recent write or erasure of the cell. In many cases, read disturbance is a transient effect upon the storage state of the cells; unlike writes or erasures, repeated reads do not necessarily result in physical degradation or wear of the cell.

While relocating read disturbed data within a memory serves a useful purpose of enhancing data integrity, it also comes with a cost. Significant system resources may be required to track the total numbers of consecutive reads on each location, and to schedule and execute garbage collection or other data migration activities to relocate data that have reached the specified limit.

In some cases, the relocation of data due to a specified read limit being reached may be an unnecessary operation, as the change in the amount of accumulated charge may not have been sufficient to place the data at risk of being unrecoverable. In other cases, factors such as variations in the construction and utilization of the cells, the operational temperature of the cells, the number of writes/erasures, etc. may result in an enhanced rate of change in accumulated charge for a total number of consecutive reads. Thus, the data in these types of cells may become read disturbed to the point of being unrecoverable long before the total number of reads reaches the specified threshold.

Accordingly, various embodiments disclosed herein are generally directed to a method and apparatus for managing data in a memory to adaptively compensate for read disturbed data. As explained below, various steps may be taken including storing data in a first location in a memory, reading the data from the first location a selected number of times, and migrating the data from the first location to a second location in the memory responsive to at least one measured parameter associated with the first location. The measured parameter may take a variety of forms, such as but not limited to operational temperature, error rate, aging, detected or estimated amounts of shift in accumulated charge, etc. Different thresholds may be established based on actual performance parameters, and these thresholds can thereafter be used for data subsequently stored in various locations.

These and other features and considerations will be discussed beginning with a review of FIG. 1, which generally illustrates an exemplary data storage device 100. The device 100 includes a controller 102 and a memory module 104. The controller 102 provides top level control for the device 100 and may be configured as a programmable processor with associated programming in local memory.

The memory module 104 can be arranged as one or more non-volatile memory elements such as rotatable recording discs or solid-state memory arrays. While a separate controller 102 is shown in FIG. 1, such is unnecessary as alternative embodiments may incorporate any requisite controller functions directly into the memory module. While not limiting, for purposes of the present discussion it will be contemplated that the data storage device 100 is a solid-state drive (SSD) that utilizes flash memory cells in the memory module 104 to provide a main data store for a host device (not shown).

The host device can be any device that communicates with the storage device 100. For example and not by way of limitation, the storage device may be physically incorporated into the host device, or the host device may communicate with the host device via a network using any suitable protocol.

Figure 2:
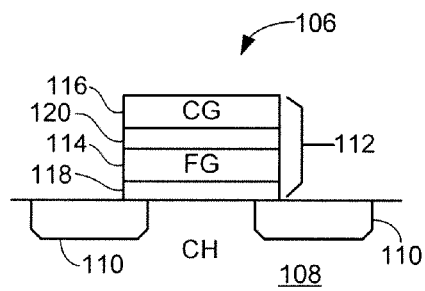
FIG. 2 shows a flash memory cell construction that can be used in the device of FIG. 1.

FIG. 2 illustrates an exemplary flash memory cell 106 that can be incorporated into the memory module 104 of FIG. 1. The memory cell 106 as shown in FIG. 2 is formed on a semiconductor substrate 108 having spaced apart n+ doped regions 110. A gate structure 112 spans the pair of adjacent doped regions so that the flash cell 106 takes a general nMOS transistor configuration. A series of adjacent flash cells can be formed in a NAND configuration with a gate structure 112 spanning each adjacent pair of doped regions 110.

Each gate structure 112 provides an alternating stack of electrically conductive gates 114, 116 and electrically insulative regions 118, 120. The gate 114 is referred to as a floating gate (FG) and the gate 116 is referred to as a control gate (CG) 116.

Data are stored by each cell 106 in relation to the relative amount of electrical charge stored on the floating gate 114. The floating gate 114 accumulates charge during a programming operation by the selected application of appropriate voltages to the adjacent doped (drain and source) regions 110 and the control gate 116. This induces a controlled migration of electrical charge from a channel (CH) portion of the semiconductor substrate 108 across the insulative region 118 to the floating gate 114.

Accumulated charge is subsequently removed from the floating gate 114 using an erasure operation. During erasure, appropriate voltages are applied to the regions 110 and the control gate 116 to induce migration of the accumulated charge from the floating gate 114, across the insulative region 118 to the channel CH.

In an initial erased state, there will be substantially no accumulated charge on the FG 114. In this state, the cell will exhibit drain-source conductivity across the channel CH without the application of any significant voltage to the control gate 116.

Once charge has been accumulated on the FG 114, however, the drain-source path will remain non-conductive unless a sufficiently high gate control voltage is applied to the control gate 116, at which point the cell becomes conductive.

The programmed state of the cell 110 can thus be determined by observing the level of control gate voltage required to allow drain-source current to pass through the cell, which indicates the amount of accumulated charge on the floating gate 114. Different, discrete amounts of total accumulated charge can therefore be used to denote different programmed states.

The cells 106 can be configured as single-level cells (SLCs) or multi-level cell (MLCs). An SLC flash cell stores a single bit; a normal convention is to assign the logical bit value of 1 to an erased cell (substantially no accumulated charge) and a logical bit value of 0 to a programmed cell (presence of accumulated charge above a predefined level).

An MLC flash memory cell stores multiple bits, such as two bits. Generally, n bits can be stored using $2^n$ storage states. A normal convention is to assign the multi-bit logical value 11 to an erased cell with charge C0 (substantially no accumulated charge), and assign other multi-bit logical values (e.g., 10, 00 and 01) to increasingly higher charge levels C1, C2 and C3 where C0<C1<C2<C3.

Figure 3:
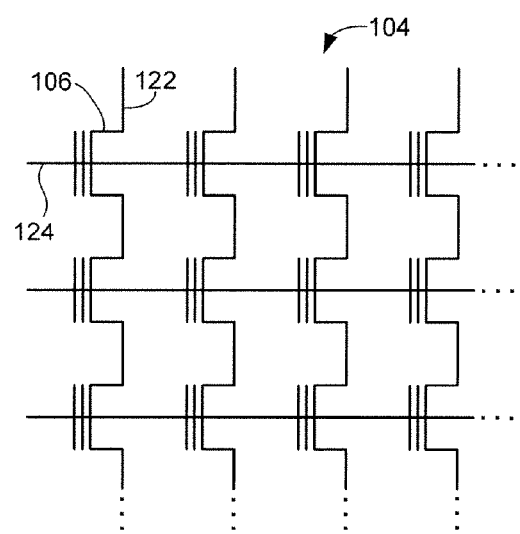
FIG. 3 is a schematic depiction of a portion of a flash memory array using the cells of FIG. 2.

The memory cells 106 can be arranged in the memory module 104 as an array of rows and columns, as generally depicted in FIG. 3. Each column of cells can be coupled via one or more bit lines (BL) 122. The control gates (CG) 116 of the cells 106 along each row can be interconnected via individual word lines (WL) 124. Various control circuits can be used to individually access the cells.

Figure 4:
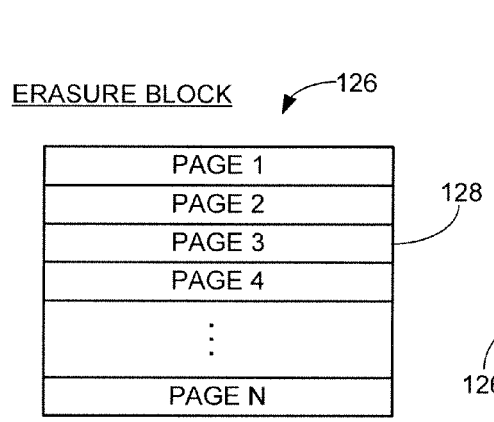
FIG. 4 illustrates a format for an erasure block.

The array of memory cells 106 shown in FIG. 3 may further be grouped into erasure blocks 126, as depicted in FIG. 4. Each erasure block 126 is a separately addressable block of memory and represents the smallest unit of memory that can be concurrent erased at a time. Each row of cells is referred to as a page 128, and each page is configured to store a selected amount of user data. In some cases, multiple pages of data may be stored to the same row of MLCs, with the most significant bit (MSB) indicating the data state of a first page of data and the least significant bit (LSB) indicating the data state of a second page of data.

Block-level wear leveling may be employed by the controller 102 to track the erase and write status of the various blocks 126. New blocks can be allocated for use as required to accommodate newly received data. Metadata and other control information to track the data may be stored in each erasure block 126, or stored elsewhere such as in specific blocks dedicated to this purpose.

Once data are written to a particular group of cells, it is usually required to erase those cells before new data may be written thereto. Data for a particular logical address (e.g., logical block address, or LBA) may be stored in a first page with a first physical address. Should the device 100 receive a write command to write new, updated data for that LBA, the controller 102 may select a second, new page with a different physical address to store the updated data, and may mark the LBA data in the first page as stale (older version) data. When all of the data in a page are superceded, the page may be marked for erasure. When enough pages in a given block are marked for erasure, a garbage collection (GC) operation may be scheduled in the background to migrate current version data to a new block and to erase the existing block.

Figure 5:
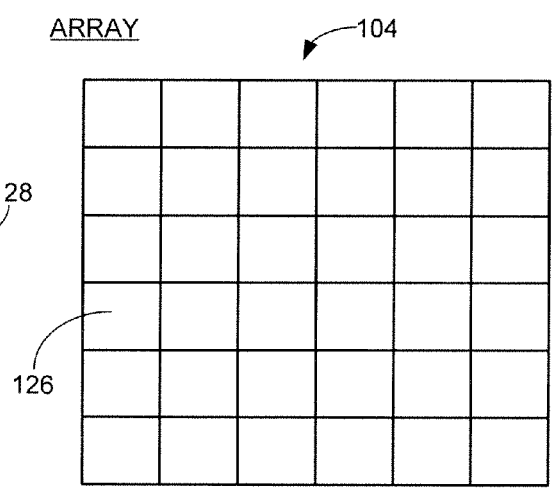
FIG. 5 is an exemplary arrangement of erasure blocks from FIG. 4.

FIG. 5 shows a portion of the memory array 104 as a grouping of erasure blocks 126 from FIG. 4. It is contemplated that the memory array 104 may include any number of such blocks, including blocks on different dies, strips, planes, chips, layers and arrays. Each of the erasure blocks 126 may be separately erasable and the controller 102 may track control information for each erasure block, such as a total number of erasures, date stamp information relating to when the various blocks have been allocated, etc. The controller may group multiple sets of the erasure blocks into larger, multi-block garbage collection units (GCUs) which are then allocated and erased as a unit.

Figure 6:
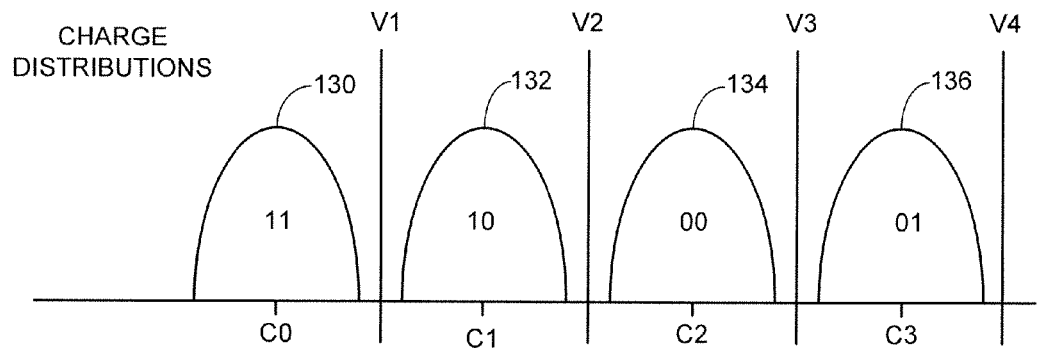
FIG. 6 shows charge distributions indicative of different data storage states for the flash memory cells in a flash memory array.

FIG. 6 shows a sequence of charge distributions 130, 132, 134 and 136. These distributions represent different groupings of memory cells 116 from FIGS. 3-5 that were stored with different charge levels during normal programming operations. Distribution 130 represents a first population of cells programmed to a first nominal charge level C0 (logical 11) state. Distribution 132 represents a second population of cells programmed to a second nominal charge level C1 (logical 10); distribution 134 represents a third population of cells programmed to a third nominal charge level C2 (logical 00); and distribution 136 represents a fourth population of cells programmed to a fourth nominal charge level C3 (logical 01). Other logical designations can be assigned to these distributions.

The populations are shown to be substantially Gaussian about the nominal charge levels C0<C1<C2<C3. The variations in charge level arise as a result of a variety of operational factors. For example, during programming a charge pump may be used to transfer discrete quanta of charge to the cells, and this process may result in slightly different total amounts of accumulated charge on individual cells programmed to the same state. Other contributing factors can including aging and manufacturing variations.

Normally, the distributions are sufficiently distinct such that intervening read sense voltages can be applied to differentiate between the respective distributions and identify the programmed state of a given cell. Four such read sense voltages are depicted in FIG. 6 as V1-V4 with V1<V2<V3<V4. By way of illustration, the application of read sense voltage V3 to the control gates of the various flash cells in FIG. 3 (via word lines 124) would tend to be sufficient to place those cells in the right-most distribution 136 into a conductive state, whereas the cells in the remaining distributions 130-134 would remain in a non-conductive state. The programmed state of any given cell can thus be quickly sensed by the application of one or more of the sense voltages V1-V4 in a sequential order.

Figure 7:
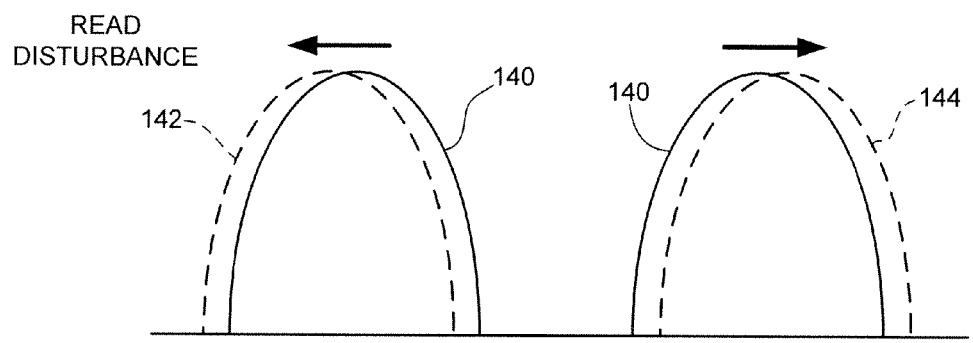
FIG. 7 illustrates exemplary changes in charge distribution that may arise through read disturbance of the data stored in a flash memory array.

FIG. 7 shows another charge distribution 140 to illustrate the shifting of charge as a result of read disturbance effects. In some cases, the repeated reading of the cells in the distribution 140 may result in a loss of accumulated charge over time, as indicated by shifted distribution 142. This shifting of the population distribution to the right generally signifies a low scale loss of charge on the various floating gates of the memory cells as the respective read thresholds are applied to the associated control gates.

In other cases, read disturbances may be exhibited as a gradual increase in the amount of accumulated charge on the floating gates, as depicted by shifted distribution 144. Depending on a variety of factors, it is contemplated that in at least some circumstances a given population of cells programmed to a given logical state may have some cells lose charge and others gain charge, resulting in a "spreading" of the distribution in both directions. The read disturb phenomenon represented in FIG. 7 can be exhibited by each of the different populations 130-136 in FIG. 6.

It will be noted that, in at least some configurations, read disturbances as represented in FIG. 7 can arise for read operations upon adjacent cells and not necessarily read operations directly upon those individual cells. Thus, a read disturbance threshold of 100K reads may represent 100,000 reads upon a given erasure block regardless of which individual cells are being read within that block.

Accordingly, various embodiments of the present disclosure generally operate to base the decision of when to copy data due to read disturbance on parameters associated with the memory location in which the data are stored. Such parameters may be taken at any appropriate resolution, such as but not limited to the erasure block level. Any number of parameters can be used, including accumulated total number of reads, the locations of the reads, temperature of the block, error rates observed during data recovery, aging of the block (or other location), delta-v (e.g., estimated shift in accumulated charge), and so on. Some of these parameters may be measured directly, and others may be measured via prediction based on other system indications.

This approach can result in improved quality assurance levels. Blocks experiencing read disturbance at a greater rate than normal can be detected and corrected prior to the incidence of an unrecoverable error. The various techniques disclosed herein further tend to reduce the time and resources required to make this determination. For example, if better than expected performance is observed with certain blocks, the intervals between measurements and/or the extent to which parameters are evaluated can be reduced.

In some embodiments, a predetermined threshold at which data migration is initiated can be adjusted based on the measured parameters. For example, a block that is specified to be copied after 100K consecutive reads may be subjected to an increased threshold of copying after 250K reads, or may be subjected to a decreased threshold so that data are copied after only 50K reads.

In other embodiments, the threshold remains the same, but various factors are weighted to provide greater or fewer total "increments" in the read count. For example, operating under elevated temperature may result in two or more increments in the total increment count for each read operation (e.g., each read operation counts as two or more reads, etc.).

In still further embodiments, a bloom filter type arrangement can be used to track and handle the increments. This can reduce the computational storage footprint to track the various parameters.

In yet other embodiments, the system can operate such that a threshold value is established (e.g., 100K reads), and once this threshold value is reached, the system takes one or more parametric measurements (e.g., measure delta-V, age, etc.). The decision whether to copy the data or not is thereafter made responsive to the measurements. An adjustment in the threshold may also occur based on the measured parameters. This adjusted threshold may thereafter be applied to subsequent data written to the associated location.

Figure 8:
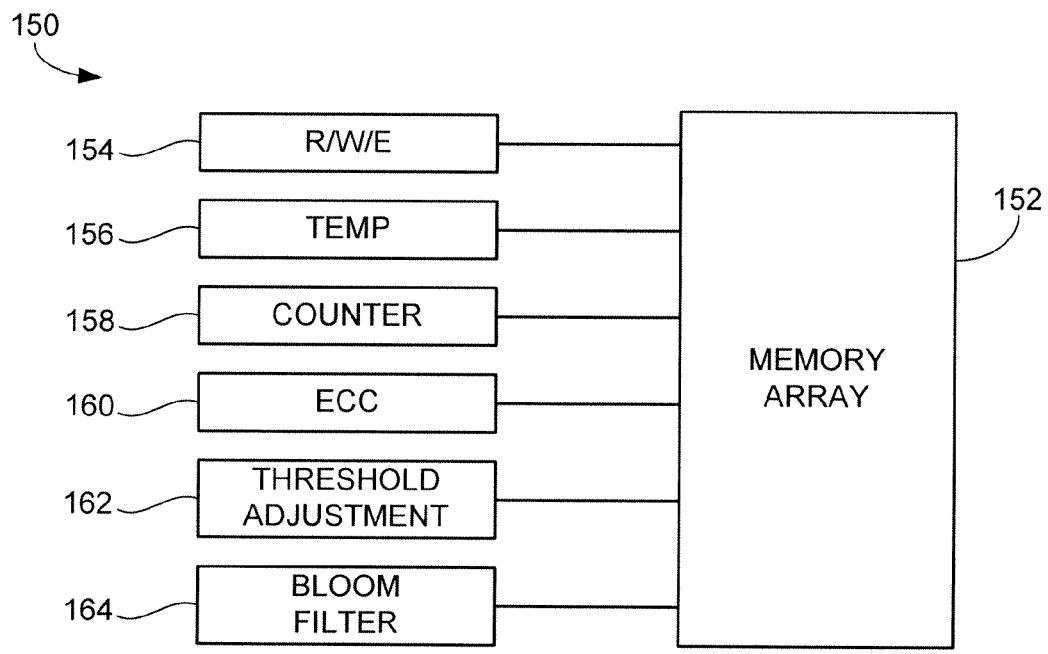
FIG. 8 depicts circuits of a storage device configured to compensate for read disturbed data in accordance with some embodiments.

FIG. 8 depicts portions of a data storage device 150 in accordance with some embodiments. The storage device 150 may be similar to the device 100 discussed above. FIG. 8 includes a data storage memory 152, which may be a flash memory array as discussed above. Other components include a read/write/erase (R/W/E) channel 154, a temperature sensor 156, an accumulated count module 158, a read threshold adjustment circuit 160, and a bloom filter module 162.

It will be appreciated that the components shown in FIG. 8 are merely exemplary and are not limiting, as a variety of other types of components may be incorporated as desired. The various components may be implemented via a programmable or hardware controller such as the controller 102 (see FIG. 1), or may be incorporated directly into the memory array.

In some embodiments, data transfers are carried out with the memory array 152 via the R/W/E channel 154. Each time a read operation is carried out upon a selected memory location, a read count is incremented by the counter module 158. Contrawise, each time a new write operation is applied to the selected memory location, and/or each time the selected memory location is erased, the count for that location is reset. It is contemplated that the read count statistics can be arranged and tracked in a variety of ways. To simplify processing, a read count may be maintained on a per-erasure block basis (see FIG. 5). Different levels of resolution may be utilized, however, including at the individual cell level, at the page level, at the GCU level, etc.

In some embodiments, an indication from the temperature sensor block 156 can be used to adjust the incremental count and/or threshold. For example, if the sensed operational temperature of the selected memory location is found to be elevated (either during specific access operations or over an extended period of time), additional increments may be provided to the read count. Alternatively or additionally, the specified migration threshold may be derated (e.g., lowered to 80K from 100K, etc.).

The bloom filter module 212 can be used to provide a weighted factor approach to track the incremental counts. In some embodiments, a weighted factoring may provide an adjusted read count such as:

$$\text{Count(Adj)} = \text{Actual Reads} + K1(\text{Temp}) + K2(\text{Age}) + K3(\text{Delta-}V) \quad (1)$$

where Count(Adj) is an adjusted count value, Actual Reads represents an actual read operation, Temp is a temperature reading/range/zone, Age represents aging of the block, and Delta-V represents detected or predicted changes in voltage threshold during a read operation. Aging can be tracked in a variety of ways, such as in relation to a total number of writes and/or erasures upon the selected memory location. The delta-V value can be utilized responsive to the application of different read voltage thresholds. It will be appreciated that other factors may be used.

Figure 9:
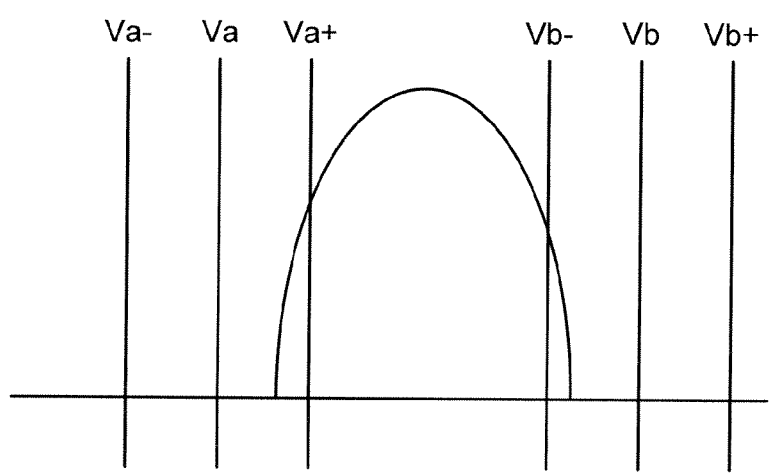
FIG. 9 illustrates application of different read voltage thresholds to evaluate the presence or absence of read disturbance effects in accordance with some embodiments.

FIG. 9 represents another exemplary population distribution 170 for a number of memory cells programmed to a selected programming state. The distribution 170 may correspond to any of the distributions 130-136, 140-144 discussed above. A first read threshold Va can be applied to determine whether one or more of the cells in the distribution 170 is rendered conductive. Additional read thresholds, such as an incremented threshold Va+ and a decremented threshold Va− can also be applied. Additional thresholds above and below the baseline threshold Va covering different intervals can also be applied.

The application of these thresholds can provide an indication of the extent to which read disturbance drift has been experienced by the cells. For example, the threshold Va may be used to sense the programmed state of the associated cells within the distribution 170, and the threshold Va+ can be used to sense the presence and extent to which read disturbance drift has been encountered.

The distribution 170 can be further evaluated using a second set of thresholds Vb, Vb+ and Vb−. The second set of thresholds can be used to evaluate the extent to which additional amounts of accumulated charge have been added to the distribution. In some embodiments, all of the cells in a given location, such as a selected erasure block, can be evaluated using respective multiple sets of thresholds to obtain an accurate statistical measurement of the shape and location of the individual programmed populations.

Figure 10:
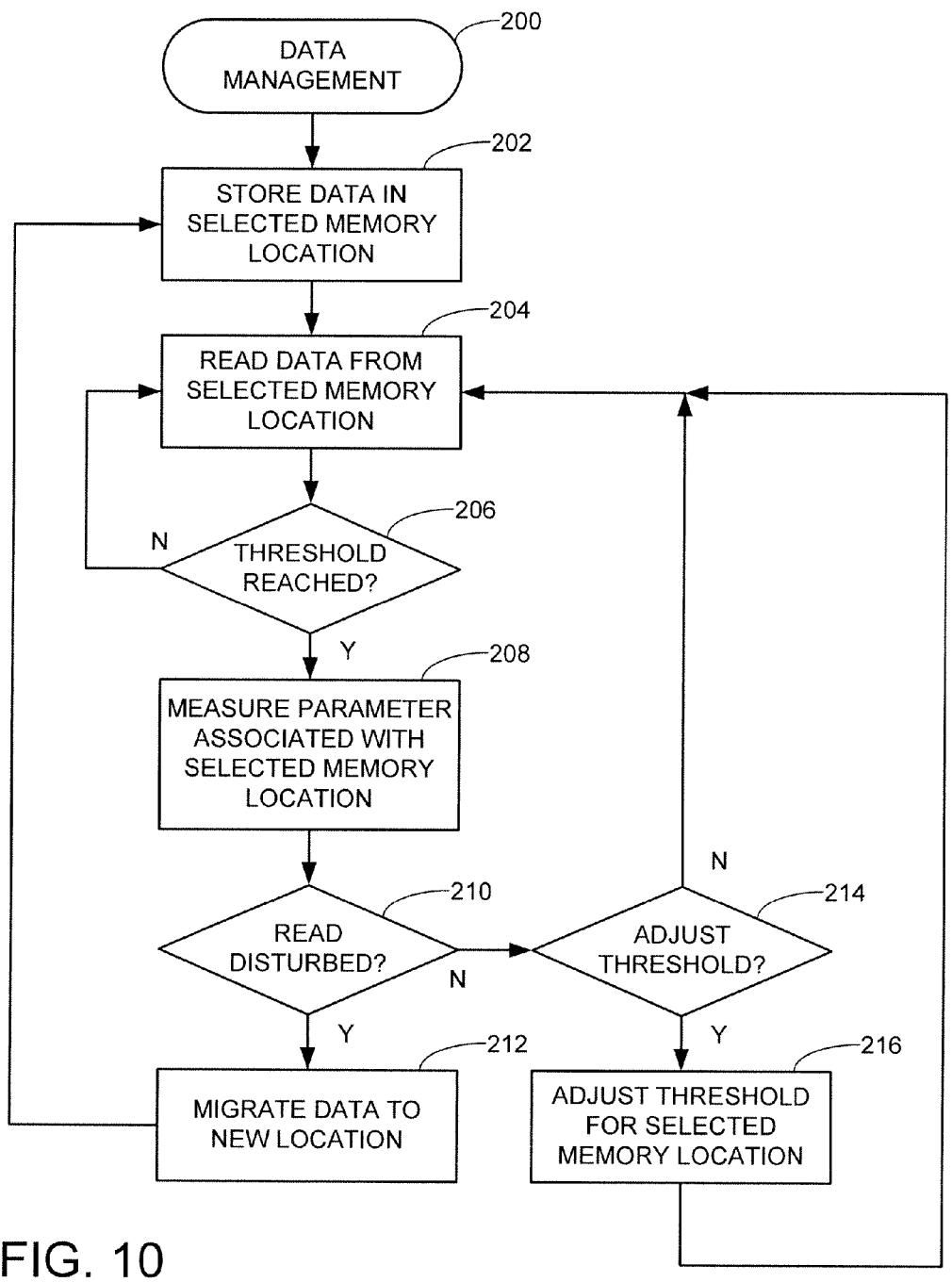
FIG. 10 is a flow chart for a DATA MANAGEMENT routine generally illustrative of steps carried out in accordance with some embodiments.

FIG. 10 provides a DATA MANAGEMENT routine 200, generally illustrative of steps that may be carried out in accordance with the various foregoing embodiments. The routine 200 may be carried out by any suitable circuitry, such as but not limited to a controller such as the controller 102 in FIG. 1 in conjunction with various operational modules such as those illustrated in FIG. 8. Alternatively, a memory module such as 104 in FIG. 1 may be provisioned with sufficient control capability to carry out these steps and report the various results as required.

Data are initially stored in a selected memory location at step 202. For purposes of the present discussion, it will be contemplated that the selected memory location is a selected erasure block 126 in the memory array 104, although other configurations can be used. The data may be user data supplied by a host device. The data may have an associated logical block address. Metadata associated with the stored data may further be generated and processed in a normal fashion.

The data are subsequently read from the selected memory location at step 204. It is contemplated, albeit not necessarily required, that the read operation be initiated responsive to a host level read command. It is further contemplated that high priority reads may result in the device caching this data in a local memory (e.g., a buffer in an interface circuit, etc.) so the total number of reads from the selected memory location may not necessarily correspond to the total number of times that the data have been requested by a host.

Decision step 206 forms a loop with step 204 and inquires whether a preselected read access threshold value has been reached for the associated data. This inquiry may be handled in a variety of ways. In some embodiments, as discussed above a counter circuit may track the number of consecutive reads that have taken place upon the data in the selected memory location. This count (or the associated threshold) may be adjusted based on other parameters, such as temperature or aging. In further embodiments, an initial derated threshold may be selected for purposes of step 206; for example, if a particular erasure block is specified for data migration after 100K reads, the initial threshold at step 206 may be a different value, such as 10K reads, etc. This would allow the system to gain an early characterization of the extent to which read disturbance is affecting the data.

At such point that the total number of reads from step 204 reaches the specified threshold of step 206, the flow continues to step 208 where one more operational parameters are measured. As discussed above, this may include temperature, aging (e.g., total number of writes/erasures for the location), delta-v, error recovery rates, or some other suitable parameter identified as potentially correlated to or otherwise indicative of the presence of read disturbance.

Step 210 follows with an inquiry as to whether the data are read disturbed. This may be based on an actual measurement of the extent to which the data are read disturbed (e.g., as discussed above in FIG. 9), or it may be a prediction based on other factors. If so, the flow passes to step 212 in which the data are migrated to a new location. This may involve a copying operation in which the data are read out of the selected location and rewritten to a new location (e.g., a new erasure block, etc.). The old location may thereafter be flagged for garbage collection, after which the various counts can be reset for this location.

As desired, information associated with the foregoing steps can be used to adjust the threshold for future data accumulation efforts as new data are stored to the selected memory location. For example, if migration was performed after a relatively few number of reads (e.g., 1000 reads, etc.), this information can be used to determine at what resolution parametric measurements should be taken for this location and/or other locations in the future.

It will be noted that the decision to proceed with the migration of the data to a new location at this point is carried out in a proactive, adaptive manner. The data may be migrated long before the data were actually rendered unrecoverable, or even rendered more difficult to recover. Nevertheless, the advanced rate at which read disturbance effects are detected are sufficient cause to proceed with the data migration operation at this point.

Continuing with the flow of FIG. 10, if the data are not found to be sufficiently read disturbed as to warrant the migration of the data, the routine can pass to another decision step 214 in which a determination is made as to whether adjustments should be made to the threshold of step 206. If so, the adjustments are made at step 216 and the routine returns as shown.

These steps help to ensure that the system is not carrying out unnecessary parametric measurements. For example, if after a first number of reads (e.g., 50K reads) substantially little or no evidence is present indicating that read disturbance is occurring, the threshold may be incremented to a substantially higher number (e.g., 150K reads, etc.).

It is contemplated that the operation of a routine such as that set forth in FIG. 10 can provide a real-time indication of read disturbance performance across a memory. In some embodiments, the system may be adapted to perform the routine of FIG. 10 on a regular basis to assess changes in the health of the array.

For example, when a set of erasure blocks are slated for garbage collection, the system might operate to internally perform a succession of reads of the stale data (without outputting the recovered data to a host) and to carry out one more parametric measurements as set forth in FIG. 10 to gain a reasonably quick and up-to-date assessment of the read disturb performance of those blocks. This might enable the selection of an appropriate set of thresholds for use once the blocks are reallocated (returned to service) for the storage of new data.

The various techniques disclosed herein may provide a number of benefits, including reduced power consumption, reduced wear, improved processing throughput and greater levels of data integrity. While the foregoing discussion has been focused primarily on the detection and amelioration of read disturbance on data stored in a flash memory array, it will be appreciated that this is merely exemplary and not limiting, as the foregoing techniques can be useful in a variety of different volatile and non-volatile memory locations. For example, these techniques can be used to compensate for adjacent track interference in a disc-based medium.

It is to be understood that even though numerous characteristics and advantages of various embodiments of the present invention have been set forth in the foregoing description, together with details of the structure and function of various embodiments of the invention, this detailed description is illustrative only, and changes may be made in detail, especially in matters of structure and arrangements of parts within the principles of the present invention to the full extent indicated by the broad general meaning of the terms in which the appended claims are expressed.

What is claimed is:

1. A method comprising storing data in a first location in a memory, successfully reading the data from the first location a selected number of times responsive to a corresponding number of host read commands to retrieve the data from the first location to a host device, using a counter to accumulate the selected number, measuring at least one parameter associated with the first location responsive to the counter reaching the selected number, and migrating the data to a second location in the memory responsive to the measured at least one parameter indicating a presence of read disturbance of said data.

2. The method of claim 1, in which the at least one parameter indicates an extent to which the stored data are affected by read disturbance in the first location, and the migration of the data to the second location is performed to compensate for said read disturbance.

3. The method of claim 1, further comprising a step of identifying a specified read threshold number responsive to a total number of consecutive reads that can be carried out on the first location prior to the data becoming unrecoverable due to read disturbance effects, and reading the data from the first location the selected number of times responsive to the specified read threshold number.

4. The method of claim 1, in which the memory comprises a flash memory array.

5. The method of claim 1, in which the at least one parameter comprises a total number of writes and/or erasures that have taken place upon the first location.

6. The method of claim 1, in which the at least one parameter comprises a change in a read voltage threshold used to detect a programmed state of memory cells at said first location.

7. The method of claim 1, in which the at least one parameter comprises an operational temperature associated with the first location.

8. The method of claim 1, further comprising steps of performing a first consecutive number of reads of the data stored at the first location, assessing a first parameter associated with the first location, and selecting a second, higher consecutive number of reads to be accomplished prior to the measuring and migrating steps responsive to the first parameter indicating an absence of read disturbance effects resulting from the first consecutive number of reads.

9. A method, comprising:
storing data in a first memory location;
performing a consecutive number of reads upon the first memory location equal to a first read threshold number, the reads successfully recovering the data stored in the first memory location;
counting the consecutive number of reads upon the first memory location;
measuring a parameter associated with the first memory location responsive to the performing step; and
migrating the data from the first memory location to a second memory location responsive to the measured parameter indicating a presence of read disturbance effects associated with the data in the first memory location.

10. The method of claim 9, further comprising selecting a second, higher read threshold number responsive to the measured parameter indicating an absence of read disturbance effects associated with the data in the first memory location, and continuing to perform consecutive reads upon the first memory location.

11. The method of claim 10, in which, responsive to a total number of said reads upon the first memory location reaching the second, higher read threshold number, further steps are carried out comprising measuring a second parameter associated with the first location and migrating the data to the second location responsive to the second parameter identifying a presence of read disturbance effects.

12. The method of claim 9, in which the measuring step comprises identifying a total number of writes and/or erasures that have taken place upon the first location.

13. The method of claim 9, in which the measuring step comprises applying a baseline read voltage threshold and at least one incremented or decremented read voltage threshold a selected interval from the baseline read voltage to detect a programmed state of memory cells at said first location.

14. The method of claim 9, in which the at least one parameter comprises an operational temperature associated with the first location.

15. The method of claim 9, in which the method is carried out by a storage device comprising a flash memory array, the storage device performing the method during a garbage collection operation upon a garbage collection unit of the array so that the consecutive reads are carried out in the background by a controller of the storage device without transferring the data read from the first location to a host device.

16. An apparatus comprising:
a memory comprising a plurality of storage locations;
a control circuit adapted to store data in a first storage location of said plurality of storage locations, direct a total number of consecutive read operations upon the first storage location a selected number of times to successfully recover the data stored in the first storage location, count the total number of consecutive read operations upon the first storage location, measure a parameter associated with the first storage location, and migrate the data from the first storage location to a different, second storage location after the data has been read the selected number of times and responsive to the measured parameter indicating a presence of read disturbance.

17. The apparatus of claim 16, in which the memory is characterized as a flash memory array and the plurality of storage locations each comprise a different erasure block in the memory array.

18. The apparatus of claim 16, in which the measured parameter comprises application of multiple read voltage thresholds to detect a programmed state of memory cells at the first storage location.

19. The apparatus of claim 16, in which the control circuit utilizes a bloom filter to generate a weighted number of adjusted read operations.

20. The apparatus of claim 16, in which the measured parameter comprises a measured temperature of the memory.

* * * * *